United States Patent
Chen

(10) Patent No.: US 10,424,601 B2
(45) Date of Patent: Sep. 24, 2019

(54) ARRAY SUBSTRATE, DISPLAY PANEL, AND DISPLAY DEVICE

(71) Applicants: HKC Corporation Limited, Shenzhen (CN); Chongqing HKC Optoelectronics Technology Co., ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 94 days.

(21) Appl. No.: 15/846,673

(22) Filed: Dec. 19, 2017

(65) Prior Publication Data

US 2018/0175066 A1    Jun. 21, 2018

Related U.S. Application Data

(63) Continuation of application No. PCT/CN2017/094276, filed on Jul. 25, 2017.

(30) Foreign Application Priority Data

Dec. 19, 2016  (CN) .......................... 2016 1 1179106

(51) Int. Cl.
*H01L 27/12* (2006.01)
*G09G 3/00* (2006.01)

(52) U.S. Cl.
CPC ........... *H01L 27/124* (2013.01); *G09G 3/006* (2013.01); *G09G 2300/0452* (2013.01)

(58) Field of Classification Search
CPC .............................. H01L 27/12; H01L 27/124
USPC ............................................................ 257/72
See application file for complete search history.

(56) References Cited

U.S. PATENT DOCUMENTS 8,031,314 B2 *  10/2011  Aramatsu ......... G02F 1/136259
                                                         349/149

* cited by examiner

*Primary Examiner* — Monica D Harrison
(74) *Attorney, Agent, or Firm* — WPAT, PC

(57) ABSTRACT

An array substrate comprising: a plurality of scanning lines (G) arranged in a first direction; a plurality of data lines (S) arranged in a second direction, wherein said scanning lines (G) and said data lines (S) intersect and insulate, a plurality of defined array areas intersected by said scanning lines (G) and by said data lines (S) are a plurality of sub-pixels, wherein the sub-pixel corresponding to the data line is a sub-pixel column, and the sub-pixel corresponding to the scanning line is a sub-pixel row; and a plurality of data lines (S) are divided into a plurality of data line groups 10 arranged in the second direction, wherein each data line group 10 comprises six data line pairs, and data lines in one data line pair connect each other; there are at least four data line pairs corresponding to the same color sub-pixel column in one said data line group, and said sub-pixels comprise at least three colors.

30 Claims, 5 Drawing Sheets

ARRAY SUBSTRATE, DISPLAY PANEL, AND DISPLAY DEVICE

CROSS-REFERENCE TO RELATED APPLICATIONS

This application claims the benefit of China Patent Application No. 2016111791068, filed on Dec. 19, 2016, in the State Intellectual Property Office of the P.R.C, the content of which is incorporated herein by reference.

BACKGROUND OF THE INVENTION

1. Field of the Invention

Aspects of the present invention relate to display technology field, especially related to array substrate, display panel, and display device.

2. Description of the Related Art

The display device as a display part of an electronic device has been widely used in various electronic products. The display device generally comprises a backlight module, a first polarizer, an array substrate, a color filter, and a second polarizer; the display device also comprise a plurality of pixels and test lines. In the RGB display panel, each pixel comprises three sub-pixels, such as red (R) sub-pixels, green (G) sub-pixels, and blue (B) sub-pixels. For such RGB display panel, its energy consumption of backlight module is higher to make the light fully through the color filter. To overcome the shortcomings of the RGB display panel, various manufacturers starts to develop the RGBW display panel which has advantages of high penetration. Each pixel in the RGBW form display panel comprise red (R) sub-pixels, green (G) sub-pixels, blue (B) sub-pixels and white sub-pixels (W). Corresponding to the white sub-pixel W, the color filter is provided with a transparent area to improve the light transmittance of the color filter and to reduce the energy consumption of the backlight module.

From RGB three-color technology to RGBW four-color technology, in order to simplify control and reduce the cost of the mask, the product design will consider to only change the color mask but share other layers as the first priory. In display panel tests, if the array substrate for testing RGB display panel is transferred directly to the WRGB four-color display panel to use two gate lines and three data lines for the test wiring, refer to FIG. 1 and FIG. 2, there will be two colors sub-pixel connected to the same data line on the WRGB four-colors display panel testing, so test screens appear color mixing and can not detect R/G/B/Y/C/M or other solid color screen; thus the mixing will affect and limit the MURA decision and cause defective product leakages.

SUMMARY OF THE INVENTION

According to various embodiments disclosed herein, the present application discloses an array substrate, a display panel, and a display device:

An array substrate comprising:
 a plurality of scanning lines arranged in a first direction;
 a plurality of data lines arranged in a second direction, wherein said scanning lines and said data lines intersect and insulate, a plurality of defined array areas intersected by said scanning lines and by said data lines are a plurality of sub-pixels, wherein the sub-pixel corresponding to the data line is a sub-pixel column, and the sub-pixel corresponding to the scanning line is a sub-pixel row;
 a plurality of data lines are divided into a plurality of data line groups arranged in the second direction, wherein each data line group comprises six data line pairs, and data lines in one data line pair connect each other; there are at least four data line pairs corresponding to the same color sub-pixel column in one said data line group, and said sub-pixels comprise at least three colors.

A display panel which comprises the above array substrate.

A display device which comprises the above display panel.

Additional aspects and/or advantages of the invention will be set forth in part in the description which follows and, in part, will be obvious from the description, or may be learned by practice of the invention.

BRIEF DESCRIPTION OF THE DRAWINGS

In order to provide a clearer description of the embodiments of the present application or the prior art, the following section briefly describes the drawings used in description of the embodiments or of the prior art. Apparently, the drawings in the following description are merely descriptions of some embodiments of the present application, so one of ordinary skill in the art could obtain drawings of other embodiments without any creative work basing on the following drawings.

DETAILED DESCRIPTION OF THE EMBODIMENTS

Figure 1:
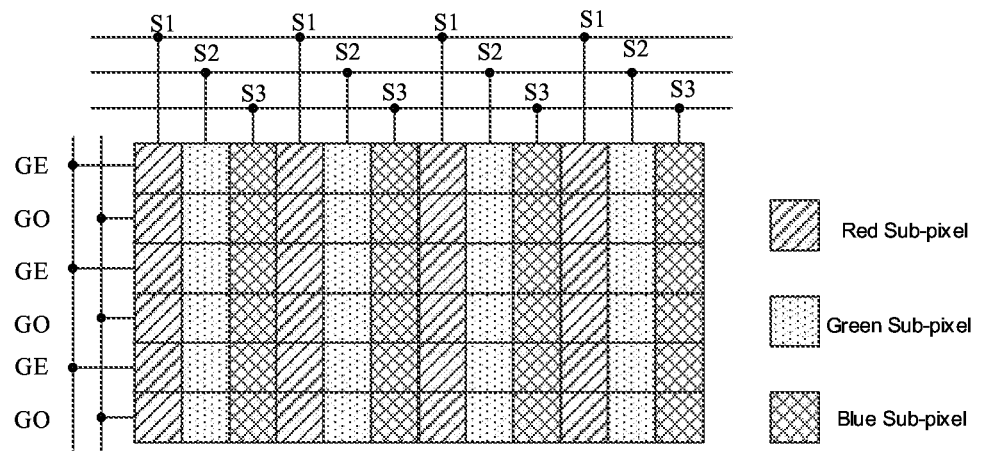
FIG. 1 is a schematic diagram of an existing RGB three-color array substrate.
Figure 2:
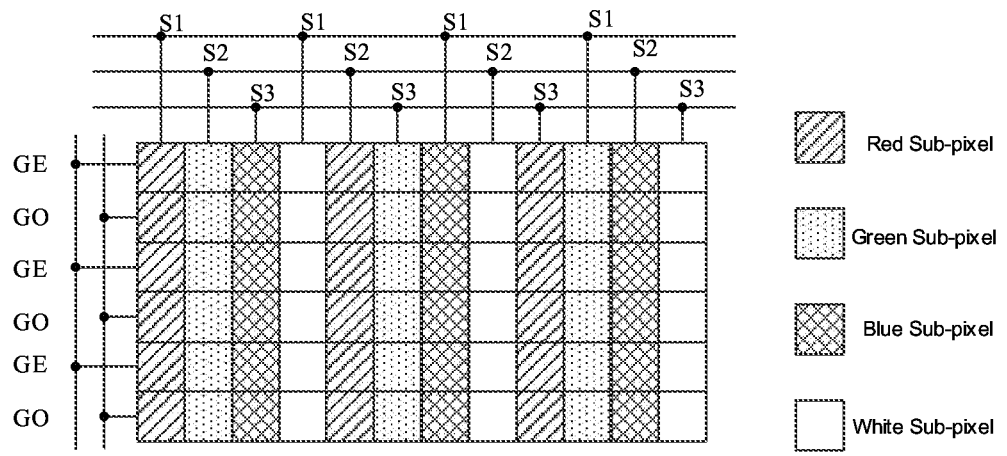
FIG. 2 is a schematic diagram of an existing RGBW four-color array substrate.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In the following detailed description, only certain exemplary embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive.

Figure 3:
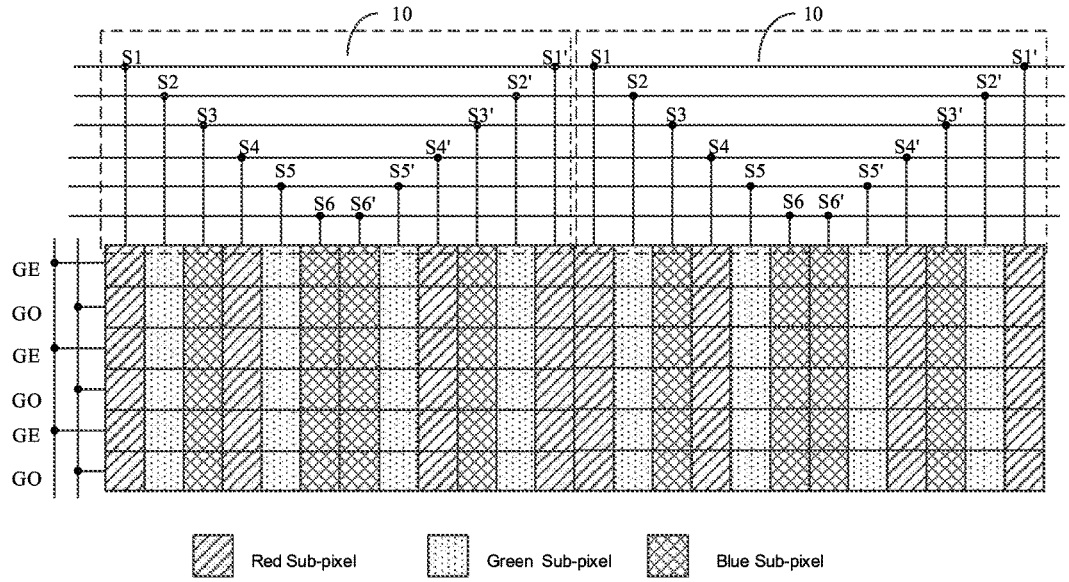
FIG. 3 is a schematic diagram of a RGB three-color array substrate in an embodiment.
Figure 4:
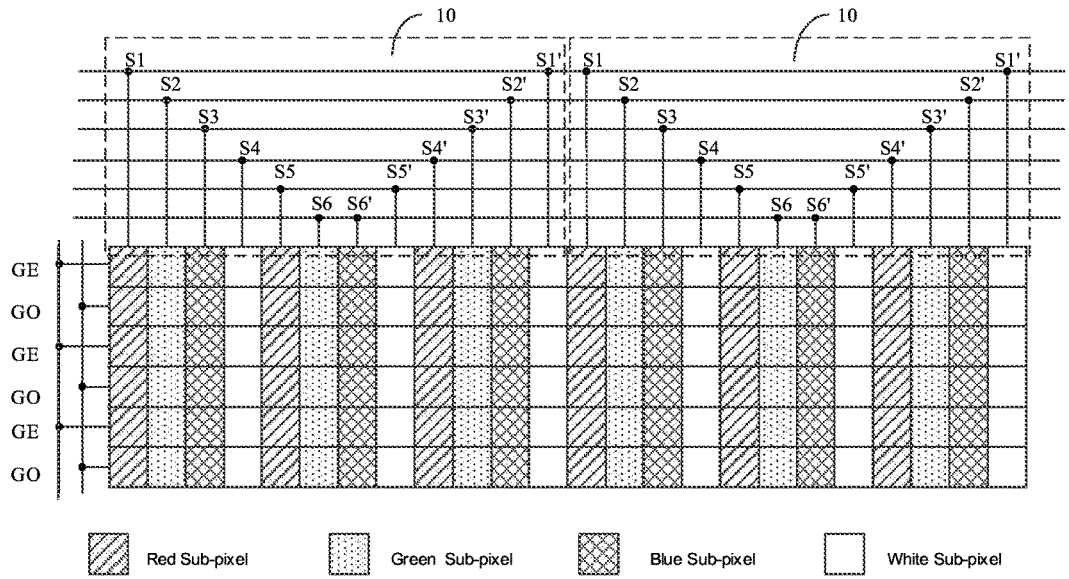
FIG. 4 is a schematic diagram of a RGBW four-color array substrate in an embodiment.

Referring to FIG. 3 and FIG. 4, in an embodiment, An array substrate comprises a plurality of scanning lines G arranged in a first direction, a plurality of data lines S arranged in a second direction, and a plurality of defined array areas intersected by said scanning lines and by said data lines are a plurality of sub-pixels; wherein said scanning lines and said data lines intersect and insulate; wherein the sub-pixel corresponding to the data line S is a sub-pixel column, and the sub-pixel corresponding to the scanning line G is a sub-pixel row. A plurality of data lines S are divided into a plurality of data line groups 10 arranged in the second direction, wherein each data line group 10 comprises six data line pairs, and data lines in one data line pair connect each other; there are at least four data line pairs corresponding to the same color sub-pixel column in one said data line group, and said sub-pixels comprise at least three colors. In particular, the three colors are red, green, and blue, or are any three colors of red, green, blue, and white.

Figure 5:
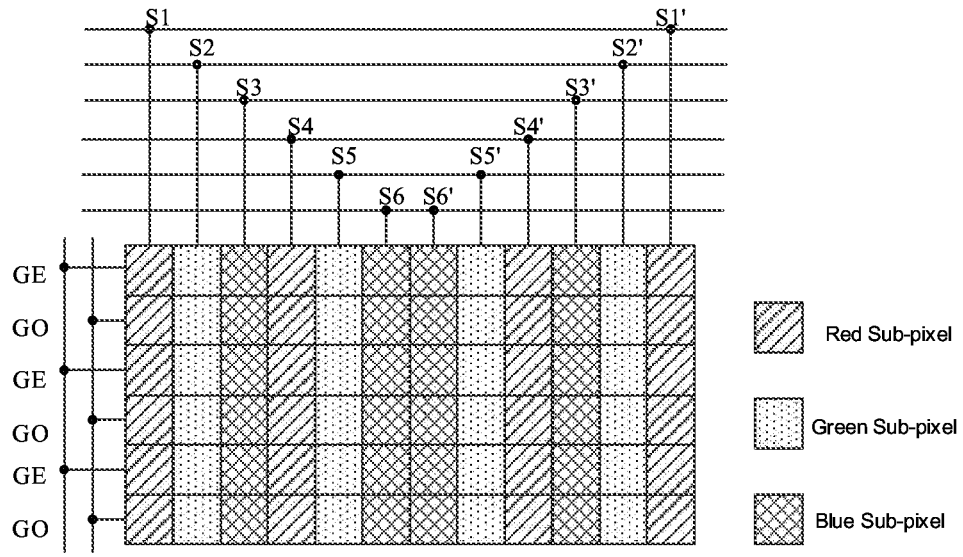
FIG. 5 is a schematic diagram of an arrangement of RGB three-color data line groups in an embodiment.

Referring to FIG. 5, in an embodiment, each data line group 10 comprises six data line pairs, and each data line pair comprises two data lines which connected each other; wherein the six data line pairs respectively are first data line pair (S1 and S1'), second data line pair (S2 and S2'), third data line pair (S3 and S3'), fourth data line pair (S4 and S4'), fifth data line pair (S5 and S5'), sixth data line pair (S6 and S6').

In an embodiment of the RGB array substrate, The array substrate of claim 2, wherein said sub-pixel row comprises three sub-pixels repeatedly arranged in the second direction, and colors of said three sub-pixels are different from each other and are red, green, or blue.

The data line group 10 comprises six data line pairs. The colors of said sub-pixel columns corresponding to the first data line pairs (S1 and S1') or the fourth data line pairs (S4 and S4') are red; in other words, the sub-pixel columns corresponding to said first data line pairs (S1 and S1') or the fourth data line pairs (S4 and S4') are red sub-pixel columns. The colors of said sub-pixel columns corresponding to the second data line pairs (S2 and S2') or the fifth data line pairs (S5 and S5') are green; in other words, the sub-pixel columns corresponding to said second data line pairs (S2 and S2') or the fifth data line pairs (S5 and S5') are green sub-pixel columns. The colors of said sub-pixel columns corresponding to the third data line pairs (S3 and S3') or the sixth data line pairs (S6 and S6') are blue; in other words, the sub-pixel columns corresponding to said third data line pairs (S3 and S3') or the sixth data line pairs (S6 and S6') are blue sub-pixel columns.

In an embodiment, S1, S2, S3, S4, S5, and S6 are arranged in order in the second direction, and S6', S5', S4', S3', S2', and S1' are arranged in order in the second direction; wherein the S6 and the S6' are next to each other; in other words, the six data line pairs are arranged symmetrically. Said sub-pixel row corresponds to scanning line; in other words, the sub-pixel row comprises four groups of three sub-pixels arranged repeatedly, wherein the colors of said three sub-pixels respectively are R, G, B; R, G, B; B, G, R; and B, G, R.

Figure 6:
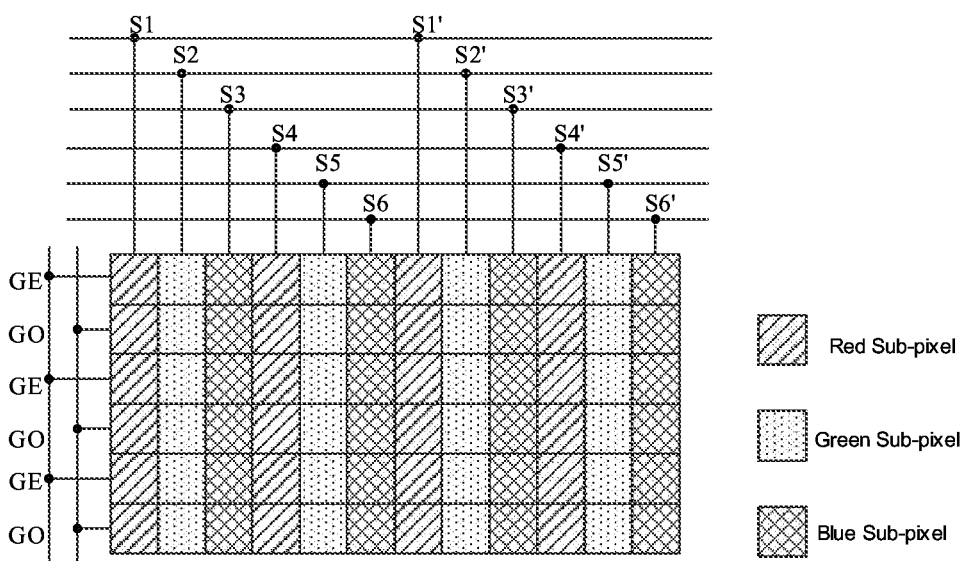
FIG. 6 is a schematic diagram of an arrangement of RGB three-color data line groups in another embodiment.

Referring to FIG. 6, in an embodiment, S1, S2, S3, S4, S5, and S6 are arranged in order in the second direction, and S1', S2', S3', S4', S5', and S6' are arranged in order in the second direction; wherein the S6 and the S1' are next to each other. Said sub-pixel row corresponds to scanning line; in other words, the sub-pixel row comprises four groups of three sub-pixels arranged repeatedly, wherein the colors of said three sub-pixels respectively are R, G, B; R, G, B; R, G, B; and R, G, B.

In testing, the first data line pair (S1 and S1') and/or said fourth data line pair (S4 and S4') receives a high level voltage signal from outside circuits, and the other data line pairs receive low level voltage signals from outside circuits, so the panel displays red color. The second data line pair (S2 and S2') and/or said fifth data line pair (S5 and S5') receives a high level voltage signal from outside circuits, and the other data line pairs receive low level voltage signals from outside circuits, so the panel displays green color. The third data line pair (S3 and S3') and/or said sixth data line pair (S6 and S6') receives a high level voltage signal from outside circuits, and the other data line pairs receive low level voltage signals from outside circuits, so the panel displays blue color. Similarly, the first data line pair (S1 and S1') and the second data line pair (S2 and S2') can simultaneously receive high level voltage signals from an external circuit to light on red and green sub-pixels simultaneously to display yellow (Y) colors; it can light on blue and green sub-pixels simultaneously to display Cyan (C) colors; it can light on red and blue sub-pixels simultaneously to display Magenta (M) colors; it can light on red, green, and blue sub-pixels simultaneously to display White (W) colors. Therefore, said array substrate can light on said W/R/G/B/Y/C/M solid color screens without any color mixing.

The data line group 10 comprises six data line pairs. Colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to any two data lines pairs of the fourth, fifth, and sixth data line pairs are identical and are red, green, or blue. Therefore, said array substrate can light on said W/R/G/B/Y/C/M solid color screens.

Figure 7:
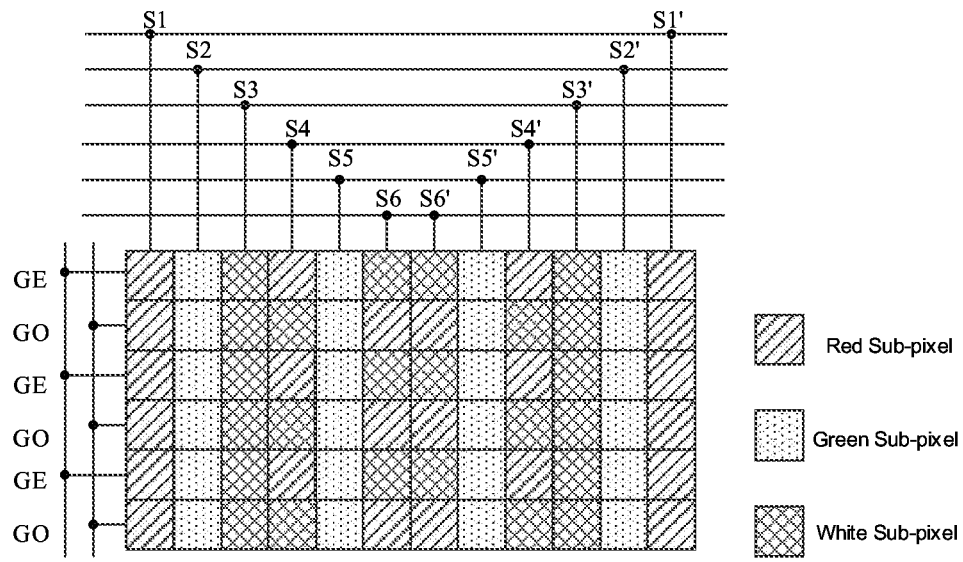
FIG. 7 is a schematic diagram of an arrangement of RGB three-color data line groups in another embodiment.

Referring to FIG. 7, in an embodiment, S1, S2, S3, S4, S5, and S6 are arranged in order in the second direction, and S6', S5', S4', S3', S2', and S1' are arranged in order in the second direction; wherein the S6 and the S6' are next to each other; in other words, the six data line pairs are arranged symmetrically. The sub-pixel rows correspond to scanning line; the first sub-pixel row comprises four groups of three sub-pixels arranged repeatedly, wherein the colors of said three sub-pixels respectively are R, G, B; R, G, B; B, G, R; and B, G, R; the second sub-pixel row comprises four groups of three sub-pixels arranged repeatedly, wherein the colors of said three sub-pixels respectively are R, G, B; B, G, R; R, G, B; and B, G, R. Therefore, the corresponding color of the fifth data line pair is green. In other embodiments, the corresponding data of the fifth data line pair may also be red or blue by a reasonable layout. Hence, said array substrate can light on said W/R/G/B/Y/C/M solid color screens.

When the RGBW four colors directly apply on the plurality of data lines and the scanning lines of the array substrate in one of the above embodiments, a sub-pixel row includes four sub-pixels repeatedly arranged in a second direction, wherein the four sub-pixels are any one of a red sub-pixel, a green sub-pixel, a blue sub-pixel, and a white sub-pixel; in other words, the color of each sub-pixel in the four sub-pixels is either red, green, blue, or white, and the colors are different from each other.

The data line group 10 comprises six data line pairs. Colors of said sub-pixel columns corresponding to the first data line pairs (S1 and S1') are red; colors of said sub-pixel columns corresponding to the second data line pairs (S2 and S2') are green; colors of said sub-pixel columns corresponding to the third data line pairs (S3 and S3') are blue; colors of said sub-pixel columns corresponding to the fourth data line pairs (S4 and S4') are white; and colors of said sub-pixel columns corresponding to the fifth data line pairs (S5 and S5') and the sixth data line pairs (S6 and S6') are any one color of red, green, blue, or white. The sub-pixel columns corresponding to the fifth data line pair (S5 and S5') and the sixth data line pair (S6 and S6') may be the same color or different.

Figure 8:
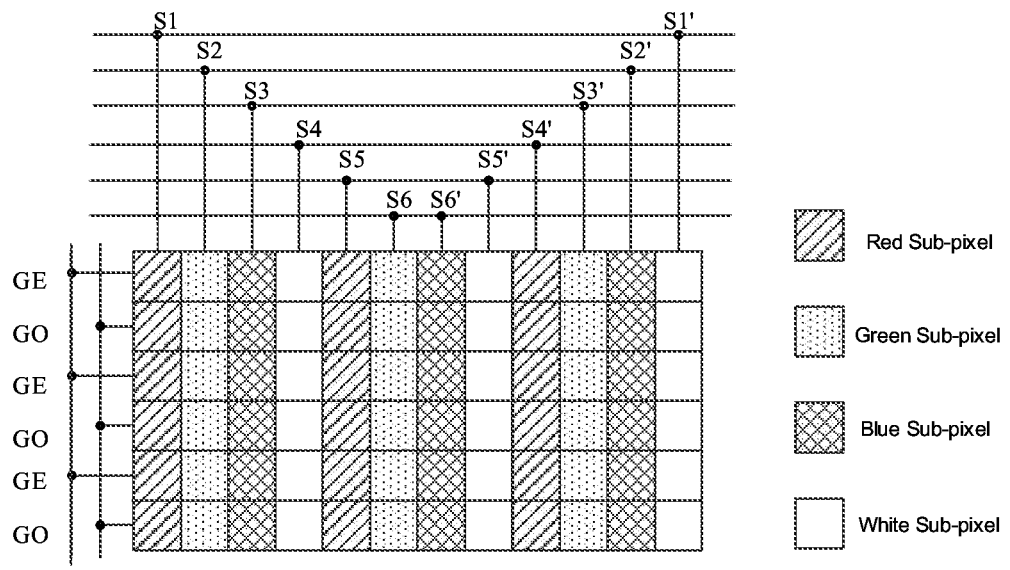
FIG. 8 is a schematic diagram of an arrangement of RGBW four-color data line groups in an embodiment.

Referring to FIG. 8, in an embodiment, the colors of the sub-pixel columns corresponding to the fifth data line pair (S5; S5 ') are all green, and the colors of the sub-pixel columns corresponding to the sixth data line pair (S6; S6') are all blue. S1, S2, S3, S4, S5, and S6 are arranged in order in the second direction, and S6', S5', S4', S3', S2', and S1' are arranged in order in the second direction; wherein the S6 and the S6' are next to each other; in other words, the six data line pairs are arranged symmetrically. The sub-pixel rows correspond to scanning line; the sub-pixel row comprises three groups of four sub-pixels arranged repeatedly, wherein the colors of said four sub-pixels respectively are R, G, B, W; R, G, B, W; and W, B, G, R.

Figure 9:
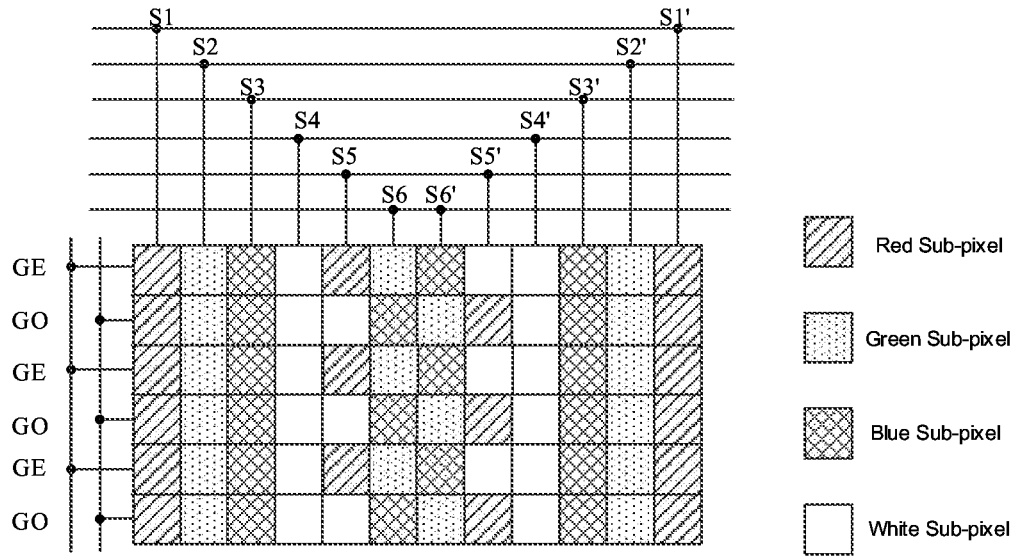
FIG. 9 is a schematic diagram of an arrangement of RGBW four-color data line groups in another embodiment.

Referring to FIG. 9, in an embodiment, the colors of the sub-pixel columns corresponding to the fifth data line pair (S5; S5') and the colors of the sub-pixel columns corresponding to the sixth data line pair (S6; S6') are all different. S1, S2, S3, S4, S5, and S6 are arranged in order in the second direction, and S6', S5', S4', S3', S2', and S1' are arranged in order in the second direction; wherein the S6 and the S6' are next to each other; in other words, the six data line pairs are arranged symmetrically. The sub-pixel rows correspond to scanning line; the first sub-pixel row comprises three groups of four sub-pixels arranged repeatedly, wherein the colors of said four sub-pixels respectively are R, G, B, W; R, G, B, W; and W, B, G, R; the second sub-pixel row comprises three groups of four sub-pixels arranged repeatedly, wherein the colors of said four sub-pixels respectively are R, G, B, W; W, B, G, R; and W, B, G, R.

Figure 10:
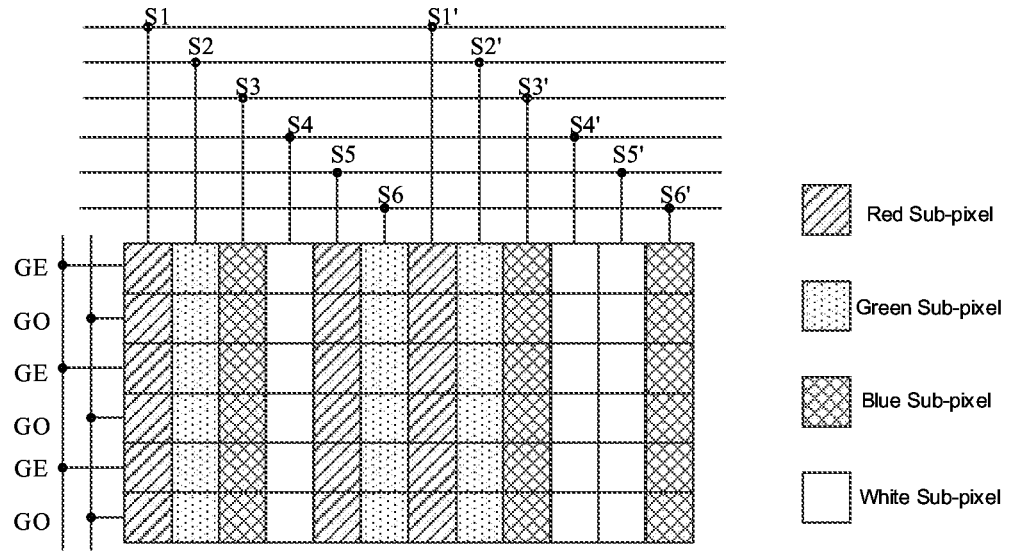
FIG. 10 is a schematic diagram of an arrangement of RGBW four-color data line groups in another embodiment.

Referring to FIG. 10, in an embodiment, S1, S2, S3, S4, S5, and S6 are arranged in order in the second direction, and S1', S2', S3', S4', S5', and S6' are arranged in order in the second direction; wherein the S6 and the S1' are next to each other; in other words, the six data line pairs are arranged symmetrically. The sub-pixel rows correspond to scanning line; the sub-pixel row comprises three groups of four sub-pixels arranged repeatedly, wherein the colors of said four sub-pixels respectively are R, G, B, W; R, G, R, G; and B, W, B, W.

In testing, the first data line pair (S1 and S1') receives a high level voltage signal from outside circuits, and the other data line pairs receive low level voltage signals from outside circuits, so the panel displays red color. The second data line pair (S2 and S2') receives a high level voltage signal from outside circuits, and the other data line pairs receive low level voltage signals from outside circuits, so the panel displays green color. The third data line pair (S3 and S3') receives a high level voltage signal from outside circuits, and the other data line pairs receive low level voltage signals from outside circuits, so the panel displays blue color. The fourth data line pair (S4 and S4') receives a high level voltage signal from outside circuits, and the other data line pairs receive low level voltage signals from outside circuits, so the panel displays white color. Similarly, the first data line pair (S1 and S1') and the second data line pair (S2 and S2') can simultaneously receive high level voltage signals from an external circuit to light on red and green sub-pixels simultaneously, so the panel displays yellow (Y) colors; it can light on blue and green sub-pixels simultaneously to display Cyan (C) colors; it can light on red and blue sub-pixels simultaneously to display Magenta (M) colors. Therefore, said array substrate can light on said W/R/G/B/Y/C/M solid color screens.

Therefore, RGB three-color, RGBW four-color can share six pairs of data pairs and a number of scanning lines of said array substrates, and for the various sub-pixel arrangement of RGB three colors and RGBW four colors, manufacturers may share masks and other skill except for color resistances so may simplify the control of the array substrate and reduce costs. Thus, test screens appear color mixing and can light on R/G/B/Y/C/M or other solid color screen without color mixing to avoid limitations of the MURA decision and to reduce defective product leakages.

The array substrate also comprises a plurality of thin film transistors (do no shown in pictures), the sources of said thin film transistors connect the data lines of corresponding sub-pixels; the gates of said thin film transistors connect the scanning lines of corresponding sub-pixels; and the drains of said thin film transistors connect electrodes of corresponding sub-pixels.

Moreover, the present invention also discloses display panels with above array substrates of each embodiments, so the display panels have all advantages showed as above. The details are not repeated.

Moreover, the present invention also discloses display devices with above array substrates of each embodiments, so the display devices have all advantages showed as above. The details are not repeated.

Although a few embodiments of the present invention have been shown and described, it would be appreciated by those skilled in the art that changes may be made in this embodiment without departing from the principles and spirit of the invention, the scope of which is defined in the claims and their equivalents.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed:

1. An array substrate comprising:
   a plurality of scanning lines arranged in a first direction;
   a plurality of data lines arranged in a second direction, wherein said scanning lines and said data lines intersect and insulate, a plurality of defined array areas intersected by said scanning lines and by said data lines are a plurality of sub-pixels, wherein the sub-pixel corresponding to the data line is a sub-pixel column, and the sub-pixel corresponding to the scanning line is a sub-pixel row; and
   wherein a plurality of data lines are divided into a plurality of data line groups arranged in the second direction, each data line group comprises six data line pairs, and data lines in one data line pair connect each other; there are at least four data line pairs corresponding to the same color sub-pixel column in one said data line group, and said sub-pixels comprise at least three colors.

2. The array substrate of claim 1, wherein said data line pair comprises two data lines which connected each other.

3. The array substrate of claim 2, wherein said sub-pixel row comprises three sub-pixels repeatedly arranged in the second direction, and colors of said three sub-pixels are red, green, or blue.

4. The array substrate of claim 3, wherein colors of said sub-pixel columns corresponding to the first data line pairs or the fourth data line pairs are red; colors of said sub-pixel columns corresponding to the second data line pair or the fifth data line pair are green; and colors of said sub-pixel columns corresponding to the third data line pair or the sixth data line pair are blue.

5. The array substrate of claim 3, wherein colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to the fourth, fifth, and sixth data line pairs are identical and are red, green, or blue.

6. The array substrate of claim 3, wherein colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to any two data lines pairs of the fourth, fifth, and sixth data line pairs are identical and are red, green, or blue.

7. The array substrate of claim 2, wherein said sub-pixel row comprises four sub-pixels repeatedly arranged in the second direction, and colors of said sub-pixel are red, green, blue, or white.

8. The array substrate of claim 7, wherein colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to the fourth data line pairs are white; and colors of said sub-pixel columns corresponding to the fifth data line pairs and the sixth data line pairs are red, green, blue, or white.

9. The array substrate of claim 8, wherein two said data lines of said sixth data line pair are set adjacently.

10. The array substrate of claim 1 comprises a plurality of thin film transistors, the sources of said thin film transistors connect the data lines of corresponding sub-pixels; the gates of said thin film transistors connect the scanning lines of corresponding sub-pixels; and the drains of said thin film transistors connect electrodes of corresponding sub-pixels.

11. A display panel with an array substrate, comprising:
a plurality of scanning lines arranged in a first direction;
a plurality of data lines arranged in a second direction, wherein said scanning lines and said data lines intersect and insulate, a plurality of defined array areas intersected by said scanning lines and by said data lines are a plurality of sub-pixels, wherein the sub-pixel corresponding to the data line is a sub-pixel column, and the sub-pixel corresponding to the scanning line is a sub-pixel row; and
a plurality of data lines are divided into a plurality of data line groups arranged in the second direction, wherein each data line group comprises six data line pairs, and data lines in one data line pair connect each other; there are at least four data line pairs corresponding to the same color sub-pixel column in one said data line group, and said sub-pixels comprise at least three colors.

12. The display panel of claim 11, wherein said data line pair comprises two data lines which connected each other.

13. The display panel of claim 12, wherein said sub-pixel row comprises three sub-pixels repeatedly arranged in the second direction, and colors of said three sub-pixels are red, green, or blue.

14. The display panel of claim 13, wherein colors of said sub-pixel columns corresponding to the first data line pairs or the fourth data line pairs are red; colors of said sub-pixel columns corresponding to the second data line pair or the fifth data line pair are green; and colors of said sub-pixel columns corresponding to the third data line pair or the sixth data line pair are blue.

15. The display panel of claim 13, wherein colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to the fourth, fifth, and sixth data line pairs are identical and are red, green, or blue.

16. The display panel of claim 13, wherein colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to any two data lines pairs of the fourth, fifth, and sixth data line pairs are identical and are red, green, or blue.

17. The display panel of claim 12, wherein said sub-pixel row comprises four sub-pixels repeatedly arranged in the second direction, and colors of said sub-pixel are red, green, blue, or white.

18. The display panel of claim 17, wherein colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to the fourth data line pairs are white; and colors of said sub-pixel columns corresponding to the fifth data line pairs and the sixth data line pairs are red, green, blue, or white.

19. The display panel of claim 18, wherein two said data lines of said sixth data line pair are set adjacently.

20. The display panel of claim 11 comprises a plurality of thin film transistors, the sources of said thin film transistors connect the data lines of corresponding sub-pixels; the gates of said thin film transistors connect the scanning lines of corresponding sub-pixels; and the drains of said thin film transistors connect electrodes of corresponding sub-pixels.

21. A display device with a display panel using an array substrate, comprising:
a plurality of scanning lines arranged in a first direction;
a plurality of data lines arranged in a second direction, wherein said scanning lines and said data lines intersect and insulate, a plurality of defined array areas intersected by said scanning lines and by said data lines are a plurality of sub-pixels, wherein the sub-pixel corresponding to the data line is a sub-pixel column, and the sub-pixel corresponding to the scanning line is a sub-pixel row; and
a plurality of data lines are divided into a plurality of data line groups arranged in the second direction, wherein each data line group comprises six data line pairs, and data lines in one data line pair connect each other; there are at least four data line pairs corresponding to the same color sub-pixel column in one said data line group, and said sub-pixels comprise at least three colors.

22. The display device of claim 21, wherein said data line pair comprises two data lines which connected each other.

23. The display device of claim 22, wherein said sub-pixel row comprises three sub-pixels repeatedly arranged in the second direction, and colors of said three sub-pixels are red, green, or blue.

24. The display device of claim 23, wherein colors of said sub-pixel columns corresponding to the first data line pairs or the fourth data line pairs are red; colors of said sub-pixel columns corresponding to the second data line pair or the fifth data line pair are green; and colors of said sub-pixel columns corresponding to the third data line pair or the sixth data line pair are blue.

25. The display device of claim 23, wherein colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to the fourth, fifth, and sixth data line pairs are identical and are red, green, or blue.

26. The display device of claim 23, wherein colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to any two data lines pairs of the fourth, fifth, and sixth data line pairs are identical and are red, green, or blue.

27. The display device of claim 22, wherein said sub-pixel row comprises four sub-pixels repeatedly arranged in the second direction, and colors of said sub-pixel are red, green, blue, or white.

28. The display device of claim 27, wherein colors of said sub-pixel columns corresponding to the first data line pairs are red; colors of said sub-pixel columns corresponding to the second data line pairs are green; colors of said sub-pixel columns corresponding to the third data line pairs are blue; colors of said sub-pixel columns corresponding to the fourth data line pairs are white; and colors of said sub-pixel columns corresponding to the fifth data line pairs and the sixth data line pairs are red, green, blue, or white.

29. The display device of claim 28, wherein two said data lines of said sixth data line pair are set adjacently.

30. The display device of claim 21 comprises a plurality of thin film transistors, the sources of said thin film transistors connect the data lines of corresponding sub-pixels; the gates of said thin film transistors connect the scanning lines of corresponding sub-pixels; and the drains of said thin film transistors connect electrodes of corresponding sub-pixels.

* * * * *